US009817050B2

(12) United States Patent
Weicker et al.

(10) Patent No.: US 9,817,050 B2
(45) Date of Patent: Nov. 14, 2017

(54) DETECTION OF WELDED CONTACTOR USING AC COUPLING

(71) Applicant: Faraday & Future Inc., Gardena, CA (US)

(72) Inventors: Phillip J. Weicker, Pasadena, CA (US); Anil Paryani, Cerritos, CA (US); Caio D Gubel, San Clemente, CA (US); Long Huynh, Gardena, CA (US)

(73) Assignee: FARADAY&FUTURE INC., Gardena, CA (US)

( * ) Notice: Subject to any disclaimer, the term of this patent is extended or adjusted under 35 U.S.C. 154(b) by 0 days.

(21) Appl. No.: 15/001,888

(22) Filed: Jan. 20, 2016

(65) Prior Publication Data
US 2017/0205455 A1 Jul. 20, 2017

(51) Int. Cl.
*G01R 31/00* (2006.01)
*G01R 31/36* (2006.01)

(52) U.S. Cl.
CPC ....... *G01R 31/006* (2013.01); *G01R 31/3606* (2013.01)

(58) Field of Classification Search
CPC ...................................... G01R 31/024–31/026
See application file for complete search history.

(56) References Cited

U.S. PATENT DOCUMENTS

| 4,335,348 A * | 6/1982 | Reed | G01R 31/026 324/529 |
| 6,580,990 B2 * | 6/2003 | Wager | B66F 9/07568 340/439 |
| 2013/0128396 A1 * | 5/2013 | Danesh | G01R 19/00 361/45 |
| 2014/0021961 A1 * | 1/2014 | Yamada | G01R 31/025 324/503 |
| 2014/0028322 A1 * | 1/2014 | Tzivanopoulos | G01R 31/3606 324/433 |

* cited by examiner

*Primary Examiner* — Clayton E Laballe
*Assistant Examiner* — Noam Reisner
(74) *Attorney, Agent, or Firm* — Finnegan, Henderson, Farabow, Garrett & Dunner, LLP

(57) ABSTRACT

A system for detecting a condition of a contactor configured to connect a battery string to a direct-current bus in a vehicle may include a controller configured to open or close the contactor. The system may also include an alternating-current (AC) signal source configured to provide an AC test signal when the controller opens the contactor. The system may further include an AC coupling circuit. The AC coupling circuit may include a primary side of the AC coupling circuit connected to the AC test signal source, and a secondary side connected to the contactor. The system may also include a detection circuit configured to receive an AC return signal corresponding to the AC test signal, and determine a defective condition of the contactor based on the AC return signal.

19 Claims, 5 Drawing Sheets

DETECTION OF WELDED CONTACTOR USING AC COUPLING

TECHNICAL FIELD

The present disclosure generally relates to systems and methods for detecting a condition of a contactor, and more specifically, to systems and methods for detecting a defective condition of a contactor configured to connect a battery from direct-current (DC) bus of a vehicle.

BACKGROUND

Battery-powered vehicles, such as electric vehicles or hybrid electric vehicles, may contain one or more high-voltage batteries connected to a DC bus. A high-voltage battery pack may be used as the primary power source of a vehicle to drive various primary loads (e.g., traction motors) and various auxiliary loads (e.g., HVAC, lighting, pumps, etc.). During operation, the battery pack or part of it may need to be taken offline due to faulty components or conditions in the battery pack. For high-voltage battery applications, such as electric vehicles, disconnecting the battery pack may be achieved by opening a contactor connected between the battery pack and the high-voltage bus. Over time, the contactors may degrade and cause a safety hazard if they fail to open or close properly. Although a defective contactor may be detected by measuring the DC current or voltage in the high-voltage DC circuit directly, such a detection method may compromise the DC isolation between the contactor and the chassis ground to which most controller circuits are referenced. The present disclosure aims to address at least some of these considerations.

SUMMARY

One aspect of the present disclosure is directed to a system for detecting a condition of a contactor configured to connect a battery string to a DC bus in a vehicle. The system may include a controller configured to open or close the contactor. The system may also include an alternating-current (AC) signal source configured to provide an AC test signal when the controller opens the contactor. The system may further include an AC coupling circuit having a primary side and a secondary side. The primary side of the AC coupling circuit may be connected to the AC test signal source, and the secondary side may be connected to the contactor. The system may also include a detection circuit configured to receive an AC return signal corresponding to the AC test signal, and detect a defective condition of the contactor based on the AC return signal.

Another aspect of the present disclosure is directed to a method for detecting a condition of a contactor configured to connect a battery string to a DC bus in a vehicle. The method may include opening, by a controller, the contactor, and providing, by an AC test signal source, an AC test signal. The AC test signal source may be connected to a primary side of an AC coupling circuit. In addition, the AC coupling circuit may have a secondary side connected to the contactor. The method may further include receiving, by a detection circuit, an AC return signal corresponding to the AC test signal, and detecting, by the detection circuit, a defective condition of the contactor based on the AC return signal.

Yet another aspect of the present disclosure is directed to a vehicle. The vehicle may include a battery string and a DC power bus. The vehicle may also include a contactor configured to connect the battery string to the DC power bus when the contactor is closed, and disconnect the battery string to the DC power bus when the contactor is open. The vehicle may further include a controller configured to open or close the contactor, and an AC signal source configured to provide an AC test signal when the controller opens the contactor. The vehicle may also include an AC coupling circuit having a primary side connected to the AC test signal source, and a secondary side connected to the contactor. The vehicle may further include a detection circuit configured to receive an AC return signal corresponding to the AC test signal, and detect a defective condition of the contactor based on the AC return signal.

DETAILED DESCRIPTION

For discussion purposes, the principles of the present disclosure are described in connection with the exemplary vehicle 100 depicted in FIG. 1. Those skilled in the art will recognize that the principles of the present disclosure may be applied in any types of machine to employ a contactor to connect a battery to a DC bus.

Figure 1:
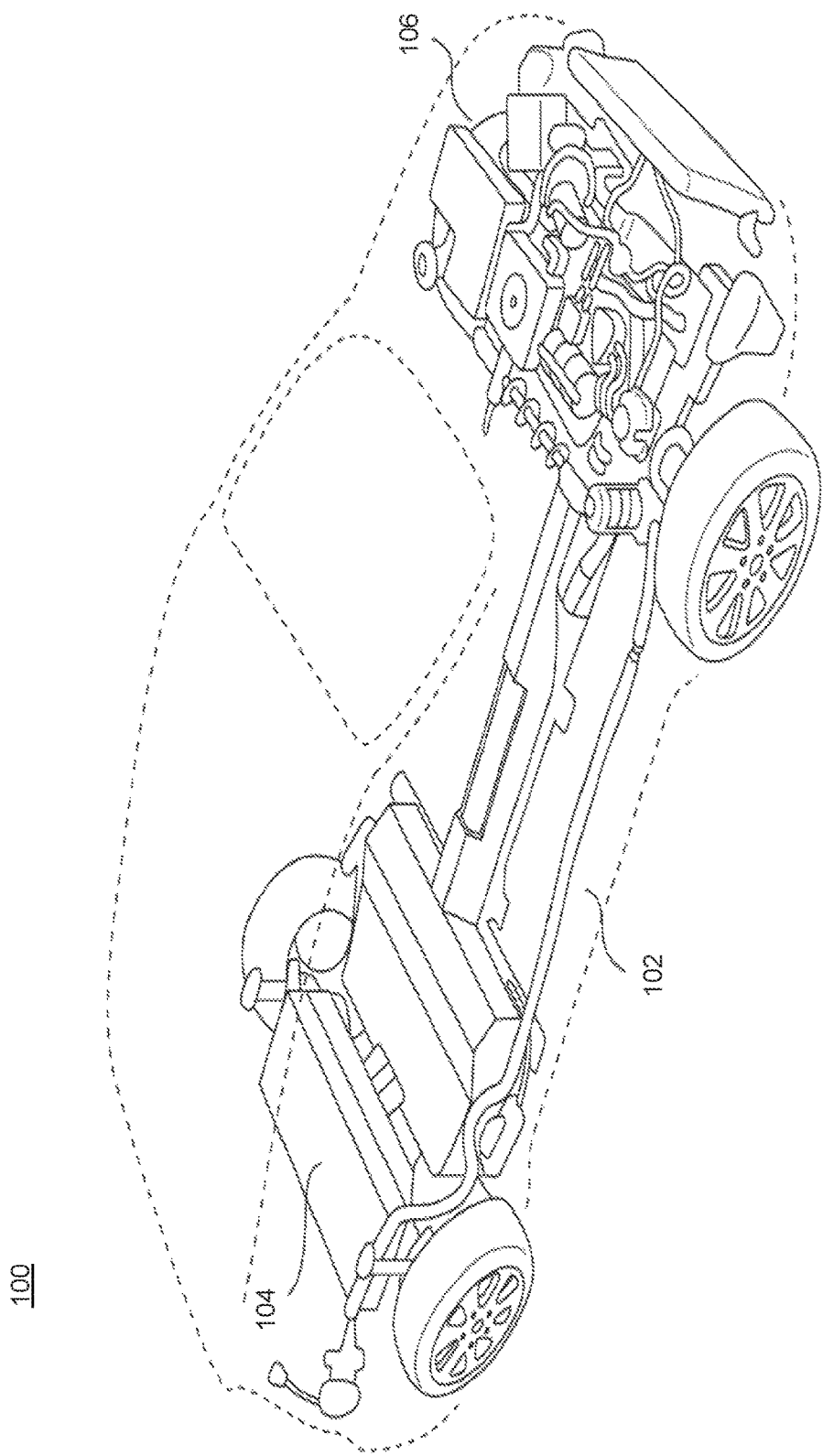
FIG. 1 is a schematic illustration of an exemplary vehicle including a system for detecting a condition of a contactor configured to connect a battery string to a DC bus according to some embodiments.

FIG. 1 is a schematic diagram illustrating a partial view of an exemplary vehicle 100. FIG. 1 will be described using an electric vehicle as an exemplary embodiment of vehicle 100, but vehicle 100 may be any type of vehicle at least partially powered by electrical power. For example, vehicle 100 may be a hybrid vehicle. Vehicle 100 may have any body style, such as a sedan, a coupe, a sports car, a truck, a station wagon, an SUV, a minivan, or a conversion van. As illustrated in FIG. 1, vehicle 100 may include a powertrain 102 (illustrated by the solid lines in FIG. 1), which may further include one or more high-voltage battery packs 104 and an electric drive system 106 connected to a common DC bus.

Although FIG. 1 shows battery packs 104 located in the chassis and toward the rear of vehicle 100, battery packs 104 may be located in any other compartment of vehicle 100 (e.g., within the hood area) or distribute evenly within the chassis. Battery packs 104 may include one or more high-voltage battery strings connected in parallel. Each battery string may further include multiple battery cells connected in series or in parallel. Each battery string may supply high-voltage DC (e.g., 400 V) to electric drive system 106. Vehicle 100 may use multiple battery strings connected in parallel to improve system reliability and power availability. The parallel configuration of the battery strings may help to ensure that disconnecting one battery string from a DC bus of vehicle 100 does not render other battery strings inoperative. Thus, each battery string may operate independently of other battery string(s), facilitating continued vehicle operation notwithstanding a failure of one or more of the other battery string(s).

Battery packs 104 may be associated with a battery management system (BMS, not shown) for managing the usage and charging of a battery string in a safe and reliable manner. Specifically, the BMS may constantly monitor the battery state of charge (SOC) and state of health (SOH). If the BMS detects a fault in a particular battery string, such as an over temperature, overcurrent, overvoltage, undervoltage, loss of voltage monitoring, or loss of isolation, the BMS may cause the faulty string to be disconnected from the DC bus. Sometimes, the faulty string may be disconnected after vehicle 100 stops and the current being drawn from the battery is at a minimum. However, to ensure safety, the faulty string is often disconnected while vehicle 100 is still running, i.e., while the DC bus is under a heavy load.

Vehicle 100 may use high power contactors or relays (not shown) to engage or disconnect a battery string from the DC bus. A contactor may include a coil associated with an armature, a moving contact mechanically coupled to the armature, and a fixed contact. Other arrangements of contacts, such as multiple moving contacts, are also contemplated. When a controller associated with the contactor directs current to the coil, a resulting magnetic field generated in the coil may attract the armature. Since the moving contact is mechanically coupled to the armature, the contactor may use the attraction to couple the moving contact with the fixed contact. The coupling of the two contacts may allow electrical current to flow from a battery string to a load. When the controller stops supplying current to the coil, the magnetic field discontinues and the moving contact is returned to its relaxed state by a force such as, for example, a spring or gravity. Consequently, the electrical connection between the battery string and the load is interrupted, preventing current flow from the battery string to the load. In other implementations of so-called "latching" contactors or relays, the contactor may contain multiple armatures and have two mechanically stable states, one where the contacts are connected and the other where the contacts are not. Energizing particular armatures may cause the contactor to transition from one state to the other.

Contactors, like most electro-mechanical devices, tend to fail after a finite number of operations. Repeated arcing associated with switching a contactor between on and off positions may cause a failure. For example, as a contactor is open and closed, the movable contact becomes disconnected from the fixed contact and begins to retract to its rest state. Immediately after disconnect, the high voltage potential between the movable contact and the fixed contact may cause arcing in a small gap that is created while the movable contact retracts to its resting state. Over time, such electrical arcing may degrade the material of the contacts, leading to uneven surfaces. This degradation may prevent even distribution of current throughout the surface of the contacts. Such degradation may eventually weaken the tolerance of one or more of the contacts to high temperatures caused by the arcing, and potentially cause the two contacts to weld together. If the contacts become welded together, the mechanism used to return the movable contact to its relaxed state may not have enough force to separate the contacts, essentially eliminating the ability to disconnect the battery from the load. Other causes of welding contacts may include, for example, a current through the contactor that exceeds the allowable current rating of the contactor, a short circuit formed by closing the contacts, or discharged capacitive load.

If a contactor fails to open, the battery could erroneously continue to supply power to the load, causing an undue energy loss and, potentially, damaging the vehicle or its components. When the battery is being charged, by a battery charger or an electric drive system operating in a regenerative braking mode, a failed contactor could lead to overcharge or overvoltage of the battery, and could lead to hazardous battery conditions. In some cases, contactor failures may cause loss of high-voltage insulation and thus may present a safety hazard. As described below, in exemplary embodiments consistent with the present disclosure, vehicle 100 may employ a system to detect a defective condition of a contactor (e.g., the contacts of a contactor have been welded together). In some embodiments, when a defective contactor is detected, the system may also provide a warning signal, inhibit certain vehicle functions, and/or disconnect the defective contactor.

Electric drive system 106 may include various loads and control units, such as an electric motor with power electronics (e.g., an inverter system) and cooling system, a transmission including a brake system, a high-voltage air conditioning for vehicle interior climate control, and the like. For example, when vehicle 100 is accelerating or maintaining a constant speed, the inverter system may convert the DC supplied by battery packs 104 into an AC for driving the electric motors. However, when vehicle 100 is operating in a regenerative-braking mode, the electric motor may operate as a generator that outputs AC, which is converted by the inverter system into DC for charging battery pack 104 and/or driving other loads of powertrain 102.

Figure 2:
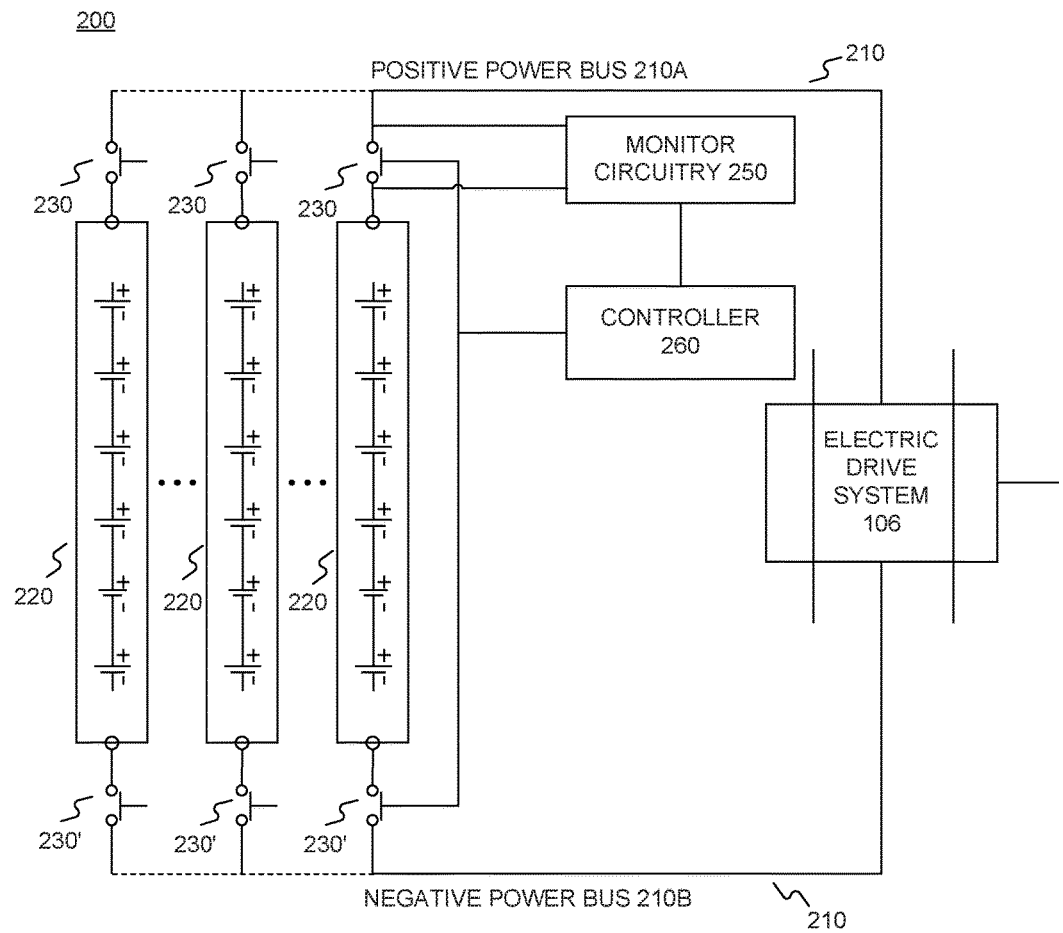
FIG. 2 is a schematic diagram illustrating an exemplary powertrain system the vehicle illustrated in FIG. 1 according to some embodiments.

FIG. 2 is a schematic diagram of an exemplary powertrain system 200 of vehicle 100, according to some embodiments. Power train system 200 may be used in vehicle 100 illustrated in FIG. 1. As illustrated in FIG. 2, powertrain system 200 may include a DC bus 210, a plurality of high-voltage battery strings 220, a plurality of contactors 230, monitoring circuitry 250, a controller 260, and an electric drive system 106.

DC bus 210 may include a positive power bus 210A and a negative power bus 210B that electrically connect various components of a powertrain of vehicle 100, including the plurality of high-voltage battery strings 220 and electric drive system 106. Each high-voltage battery string 220 may be equipped with switching devices, such as a plurality of contactors 230, to connect battery string 220 and to disconnect them from DC bus 210. For example, if an operator of vehicle 100 turns off the vehicle, controller 260 opens contactors 230, thereby disengaging the plurality of battery strings 220 from DC bus 210. In another example, when vehicle 100 is running but a particular battery string 220 experiences a faulty condition (e.g., an over temperature, overcurrent, overvoltage, undervoltage, loss of voltage monitoring, or loss of isolation), controller 260 may open one or more contactors 230 associated with the faulty string, which may then be disconnected from DC bus 210.

In some embodiments, each high-voltage battery string 220 may be connected with a pair of contactors 230 and 230'. Contactor 230 is configured to connect (contactor 230 being closed) or disconnect (contactor 230 being open) a positive terminal of battery string 220, and contactor 230' is configured to connect or disconnect a negative terminal of battery string 220. As such, battery string 220 may be disconnected from DC bus 210 when one or both contactors 230 are open.

In some embodiments, each contactor 230 may include a movable contact and a fixed contact. The movable contact may be mechanically coupled to an armature associated with a coil. The coil may be further connected to controller 260. When controller 260 energizes the coil, a magnetic field may be induced in the coil. The magnetic field may interact with the metallic material in the armature, and cause movement of the armature and the movable contact. Thus, controller 260 may control the closing and opening of contactor 230. Although FIG. 2 shows a controller 260 connected with a pair of contactors 230 and 230', other contactors 230 and 230' may be connected to and controlled by the same or a different controller 260.

During a normal operation of vehicle 100, the plurality of battery strings 220 may be connected to DC bus 210 (i.e., all contactors 230 and 230' closed) to supply power to the loads connected to DC bus 210. For example, while vehicle 100 is accelerating or maintaining a speed, one or more systems of vehicle 100 may draw a certain amount of current from each battery string 220.

In some embodiments, powertrain system 200 may include monitor circuitry 250 coupled to each contactor 230 and controller 260. Although FIG. 2 only shows monitoring circuitry 250 being coupled to one contactor 230, it is contemplated that monitoring circuitry 250 may be connected to other contactors 230 and 230' as well. Monitoring circuitry 250 may be configured to detect a defective condition of contactor(s) 230. In some embodiments, if a defective contactor is detected, monitor circuitry 250 may provide a warning signal indicating the defective contactor. Controller 260 may be notified of the defective contactor. In some embodiments, the operator may be notified so that the defective contactor may be repaired or replaced timely. In some embodiments, the battery string associated with the defective contactor may be disconnected from DC bus 210. For example, if monitor circuitry 250 detects that contactor 230 associated with a battery string is defective, monitor circuitry 250 may provide a warning signal to controller 260 indicating the defective contactor. Controller 260 may then open the contactor 230' that is paired with the defective contactor 230, thereby disengaging battery string 220 from DC bus 210. Alternatively or additionally, controller 260 may inhibit one or more functions of vehicle 100 if a defective contactor is detected.

Figure 3:
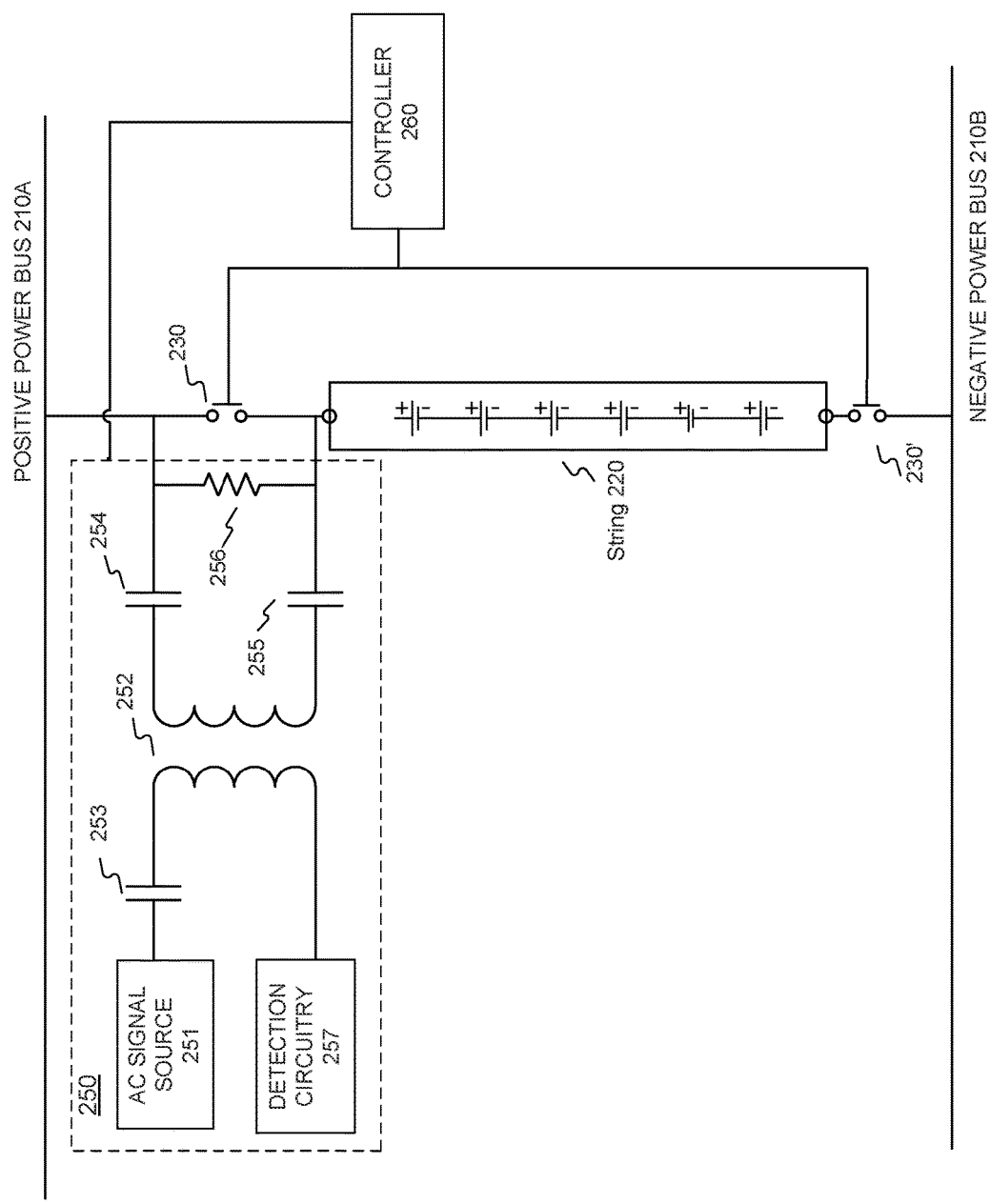
FIG. 3 is a schematic diagram illustrating an exemplary circuit used in the system of FIG. 2 according to some embodiments.

FIG. 3 is a schematic diagram of an exemplary monitor circuitry 250 that may be implemented in powertrain system 200 for detecting a defective condition of contactor 230 according to some embodiments. As illustrated in FIG. 3, monitor circuitry 250 may be connected to contactor 230 and controller 260. Monitor circuitry 250 may include an AC signal source 251, an AC coupling circuit 252, a plurality of capacitors 253, 254, and 255, a resistor 256, and detection circuitry 257. AC signal source 251 may be configured to generate an AC test signal. In some embodiments, controller 260 may send a control signal to AC signal source 251 when it opens or closes contactor 230, and AC signal source 251 may generate an AC test signal based on the received control signal. The AC test signal may be transmitted to contactor 230 through various components of monitor circuitry 250. The AC test signal may have an amplitude ranging from about 1 µA to about 20 mA<The AC test signal may also have a frequency ranging from about 100 kHz to about 10 MHz.

AC signal source 251 may be connected to AC coupling circuit 252 directly or via capacitor 253. AC coupling circuit 252 may have a primary side and a secondary side. AC coupling circuit 252 may be configured to transfer electrical signals between the circuit at the primary side and the circuit at the secondary side. The primary side of AC coupling circuit 252 may be connected to AC signal source 251 (directly or via capacitor 253) and configured to receive the AC test signal generated by AC signal source 251. The second secondary side of AC coupling circuit 252 may be connected to contactor via capacitors 254 and/or 255. In some embodiments, resistor 256 may be connected to the secondary side of AC coupling circuit 252 in parallel to contactor 230. In some embodiments, AC coupling circuit 252 may be a transformer having a primary winding and a secondary winding.

In some embodiments, a DC isolation exists between the contactors and the chassis ground, to which many controller circuits, such as controller 260, may reference. By using an AC test signal coupled to the DC circuit through DC isolated components such as AC coupling circuit 252 and capacitors 254 and/or 255, the DC isolation may be maintained to ensure safety.

Detection circuitry 257 may be configured to detect an AC return signal corresponding to the AC test signal generated by AC signal source 251. In some embodiments, detection circuitry 257 may be connected to the primary side of AC coupling circuit 252. Detection circuitry 257 may further determine whether contactor 230 is defective (e.g., whether the contacts of contactor 230 are welded together) based on the detected AC return signal. For example, detection circuitry 257 may determine whether amplitude of the detected AC return signal exceeds a threshold. If so, detection circuitry 257 may determine that contactor 230 is defective. In some embodiments, detection circuitry 257 may provide a warning signal indicating the defective contactor 230. Controller 260 may receive the warning signal. Controller 260 may open contactor 230' paired with the defective contactor 230 such that battery string 220 will be disconnected from DC bus 210. In some embodiments, controller 260 may activate a protection mechanism (not shown) to disconnect the battery string from the DC bus. Detection circuitry 257 may be part of controller 260, or independent from controller 260.

Figure 4:
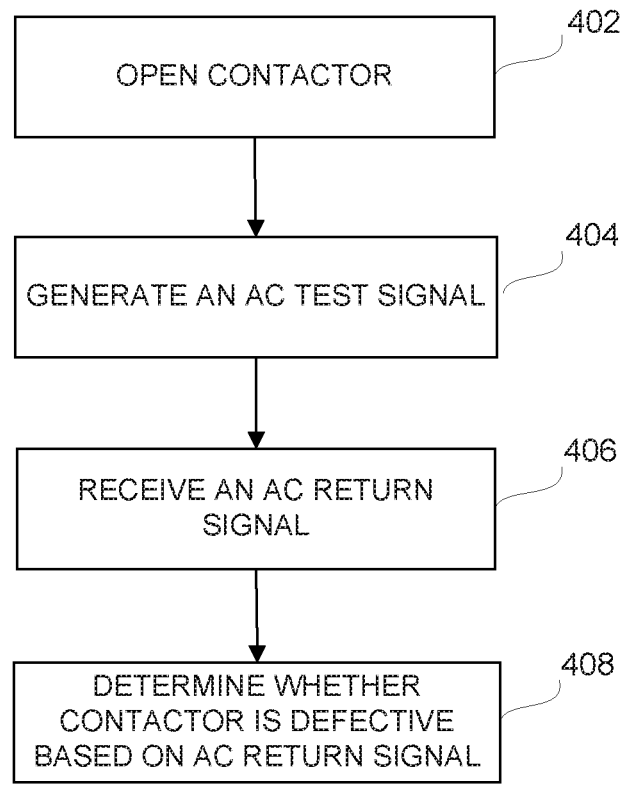
FIG. 4 is a flowchart of an exemplary process performed by the system of FIG. 2 according to some embodiments.

FIG. 4 is a flowchart of an exemplary process 400 that may be performed by circuit 300 of FIG. 3. For example, at 402, controller 260 may open contactor 230 that is subject to testing. Controller 260 may also transmit a signal to AC signal source 251 to generate an AC test signal. At 404, AC signal source 251 may generate an AC test signal based on the received signal from controller 260. In some embodiments, controller 260 may adjust the amplitude and frequency of the AC test signal. The AC test signal may be applied to contactor 230 through the primary side and secondary side of AC coupling circuit 252.

At 406, detection circuitry 257 may detect an AC return signal corresponding to the AC test signal. In some embodiments, detection circuitry 257 may detect the AC return signal at the primary side of AC coupling circuit 252. In other embodiments, detection circuitry 257 may detect the AC return signal at the secondary side of AC coupling circuit 252. At 408, detection circuitry 257 may determine whether contactor 230 is defective based on the detected AC return signal. For example, detection circuitry 257 may determine an amplitude of the detected AC return signal. Detection circuitry 257 may also determine whether the determined amplitude of the AC return signal exceeds a threshold. If so, detection circuitry 257 may determine that contactor 230 may be defective. In some embodiments, the threshold may be any number between about 1 µA to about 20 mA.

In some embodiments, detection circuitry 257 may determine the reflected impedance of the secondary circuit of AC coupling circuit 252 based on the current of the detected AC return signal and the voltage of the AC test signal generated by AC signal source 251. The amplitude of the detected AC return signal may be detected by detection circuitry 257, while information relating to the amplitude of the AC test signal may be received by detection circuitry 257 from contactor 230 and/or AC signal source 251. Detection circuitry 257 may also determine whether the determined impedance is equal to or less than a threshold. The threshold may be the impedance value determined when the contactor is short-circuited or closed. If the determined impedance is equal to or less than the threshold, detection circuitry 257 may determine contactor 230 is defective.

In some embodiments, if contactor 230 is detected as defective, detection circuitry 257 may provide a warning signal indicating the defective contactor 230. For example, detection circuitry 257 may generate a warning signal indicating a particular contactor 230 is defective. In some embodiments, detection circuitry 257 may transmit the warning signal to controller 260. After receiving the warning signal, controller 260 may open contactor 230' paired with the battery string that is associated with the defective contactor, thereby disengaging the battery string from the DC bus. Alternatively or additionally, controller 260 may activate a protection mechanism to prevent or disconnect the battery string from the DC bus. Alternatively or additionally, controller 260 may provide information to vehicle 100 to inhibit certain functions of the vehicle 100 or provide a warning to the user.

Figure 5:
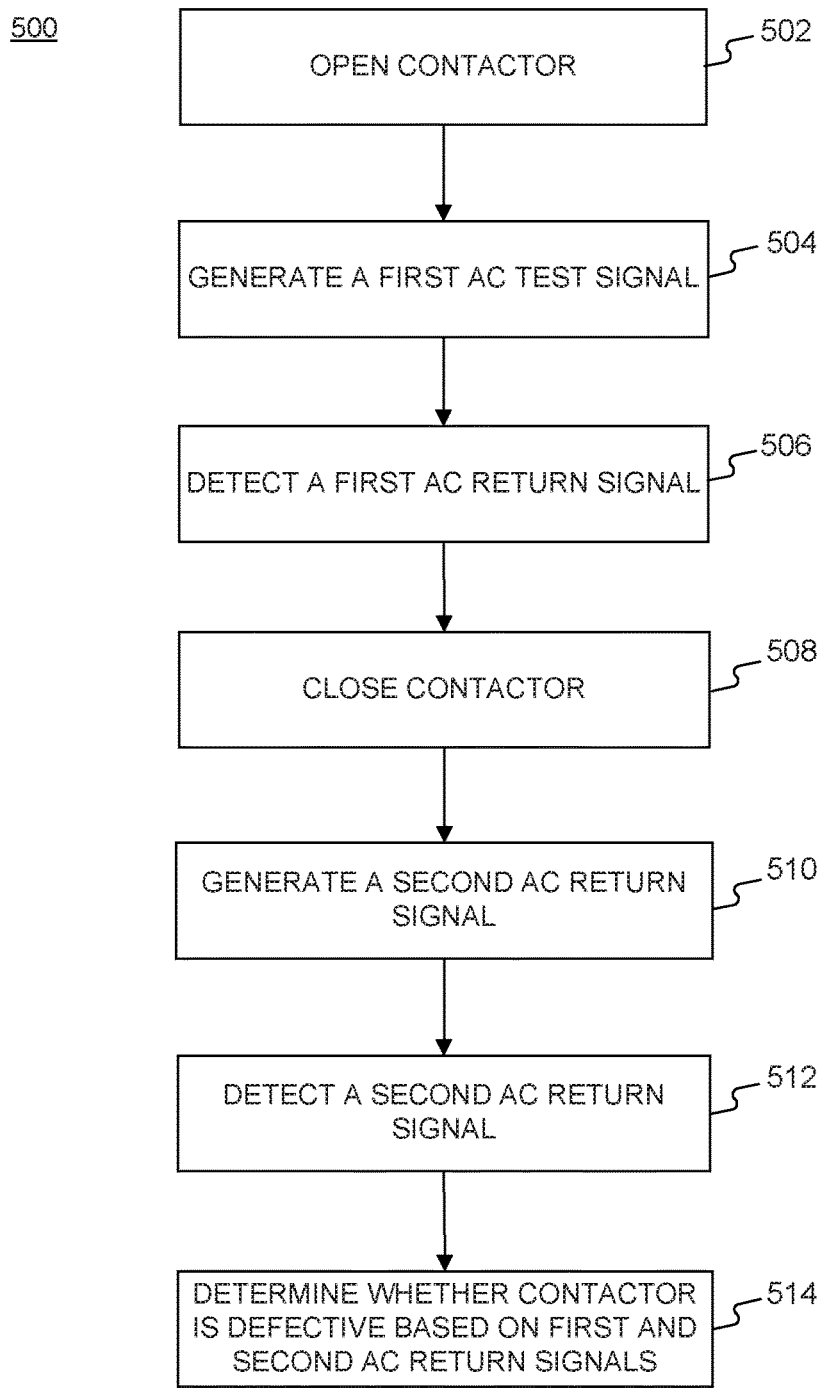
FIG. 5 is a flowchart of an exemplary process performed by the system of FIG. 2 according to some embodiments.

FIG. 5 is a flowchart of another exemplary process 500 that may be performed by the system of FIG. 2. For example, at 502, controller 260 may open contactor 230 that is subject to testing. Controller 260 may also transmit a first signal to AC signal source 251 to generate a first AC test signal. At 504, AC signal source 251 may generate a first AC test signal based on the received first signal. In some embodiments, controller 260 may adjust the amplitude and/or frequency of the first AC test signal to be generated by AC signal source 251. The first AC test signal may be applied to contactor 230 through the primary side and secondary side of AC coupling circuit 252. At 506, detection circuitry 257 may detect a first AC return signal corresponding to the first AC test signal. In some embodiments, detection circuitry 257 may detect the first AC return signal at the primary side of AC coupling circuit 252. In other embodiments, detection circuitry 257 may detect the first AC return signal at the secondary side of AC coupling circuit 252.

At 508, controller 260 may close contactor 230. Controller 260 may also transmit a second signal to AC signal source 251 to generate a second AC test signal. At 510, AC signal source 251 may generate a second AC test signal based on the received second signal. In some embodiments, controller 260 may adjust the amplitude and/or frequency of the second AC test signal to be generated by AC signal source 251. The second AC test signal may be applied to contactor 230 through the primary side and secondary side of AC coupling circuit 252. At 512, detection circuitry 257 may detect a second AC return signal corresponding to the second AC test signal. In some embodiments, detection circuitry 257 may detect the second AC return signal at the primary side of AC coupling circuit 252. In other embodiments, detection circuitry 257 may detect the second AC return signal at the secondary side of AC coupling circuit 252.

At 514, detection circuitry 257 may determine whether contactor 230 is defective based on the detected first and second AC return signals. For example, detection circuitry 257 may determine a difference between the amplitude of the first AC return signal and that of the second AC return signal. The amplitudes of the first and second AC return signals may be detected by detection circuitry 257, while the information relating to the amplitudes of the first and second AC test signals may be received by detection circuitry 257 from controller 260 and/or AC signal source 251. Detection circuitry 257 may further determine whether the determined difference is less than a threshold. If so, detection circuitry 257 may determine that contactor 230 is defective. Alternatively or additionally, detection circuitry 257 may determine a ratio of the amplitude of the first AC return signal to that of the second AC return signal. Detection circuitry 257 may also determine whether the determined ratio exceeds a threshold ratio. If so, detection circuitry 257 may determine contactor 230 is defective.

In some embodiments, if contactor 230 is detected as defective, detection circuitry 257 may provide a warning signal indicating the defective contactor 230. For example, detection circuitry 257 may generate a warning signal indicating a particular contactor 230 is defective. Detection circuitry 257 may also transmit the warning signal to controller 260. After receiving the warning signal, controller 260 may open contactor 230' that is paired with the defective contactor, thereby disengaging the battery string from DC bus 210. Alternatively or additionally, controller 260 may activate a protection mechanism to disconnect battery string 220 from DC bus 210.

While illustrative embodiments have been described herein, the scope of any and all embodiments having equivalent elements, modifications, omissions, combinations (e.g., of aspects across various embodiments), adaptations and/or alterations as would be appreciated by those skilled in the art based on the present disclosure. The limitations in the claims are to be interpreted broadly based on the language employed in the claims and not limited to examples described in the present specification or during the prosecution of the disclosure. The examples are to be construed as non-exclusive. Furthermore, the steps of the disclosed routines may be modified in any manner, including by reordering steps and/or inserting or deleting steps. In particular, non-dependent steps may be performed in any order, or in parallel. It is intended, therefore, that the specification and examples be considered as illustrative only, with a true scope and spirit being indicated by the following claims and their full scope of equivalents.

What is claimed is:

1. A system for detecting a condition of a contactor configured to connect a battery string to a direct-current (DC) bus in a vehicle, the system comprising:
    a controller configured to open or close the contactor;
    an alternating-current (AC) signal source configured to provide a first AC test signal when the controller opens the contactor;
    an AC coupling circuit having a primary side and a secondary side, the primary side being connected to the AC test signal source, the secondary side connected to the contactor;
    a detection circuit configured to:
        receive a first AC return signal corresponding to the first AC test signal, and
        detect a defective condition of the contactor based on the first AC return signal; and
    at least one capacitor coupled between the secondary side of the coupling circuit and the contactor.

2. The system of claim 1, wherein the detection circuit is further configured to:
    determine an amplitude of the first AC return signal; and detect the defective condition of the contactor if the amplitude of the first AC return signal exceeds a threshold.

3. The system of claim 1, wherein:
the AC test signal source is further configured to provide a second AC test signal when the controller closes the contactor; and
the detection circuit is further configured to:
receive a second AC return signal corresponding to the second AC test signal, and
detect the defective condition of the contactor based on the first and second AC return signals.

4. The system of claim 3, wherein the detection circuit is further configured to:
determine a difference between an amplitude of the first AC return signal and an amplitude of the second AC return signal; and
detect the defective condition of the contactor if the determined difference is less than a threshold.

5. The system of claim 1, wherein the controller is further configured to disconnect the battery string from the DC power bus if the contactor is defective.

6. The system of claim 1, wherein the first AC test signal has an amplitude ranging from about 10 μA to 25 mA and a frequency ranging from about 100 kHz to about 10 MHz.

7. The system of claim 1, wherein the coupling circuit is a transformer.

8. The system of claim 1, further comprising a resistor connected in parallel with the contactor.

9. The system of claim 1, wherein the detection circuit is further configured to provide a warning signal if the defective condition of the contactor is detected.

10. A vehicle, comprising:
a battery string;
a direct-current (DC) power bus;
a contactor configured to connect the battery string to the DC power bus;
a controller configured to open or close the contactor;
an alternating-current (AC) signal source configured to provide an AC test signal when the controller opens the contactor;
an AC coupling circuit having a primary side and a secondary side, the primary side connected to the AC test signal source, the secondary side connected to the contactor;
a detection circuit configured to:
detect an AC return signal corresponding to the AC test signal, and
determine a defective condition of the contactor based on the AC return signal; and
at least one capacitor coupled between the secondary side of the coupling circuit and the contactor.

11. A system for detecting a condition of a contactor configured to connect a battery string to a direct-current (DC) bus in a vehicle, the system comprising:

a controller configured to open or close the contactor;
an alternating-current (AC) signal source configured to provide a first AC test signal when the controller opens the contactor;
an AC coupling circuit having a primary side and a secondary side, the primary side being connected to the AC test signal source, the secondary side connected to the contactor;
a detection circuit configured to:
receive a first AC return signal corresponding to the first AC test signal, and
detect a defective condition of the contactor based on the first AC return signal; and
at least one capacitor coupled between the primary side of the coupling circuit and the AC test signal source.

12. The system of claim 11, wherein the detection circuit is further configured to:
determine an amplitude of the first AC return signal; and
detect the defective condition of the contactor if the amplitude of the first AC return signal exceeds a threshold.

13. The system of claim 11, wherein:
the AC test signal source is further configured to provide a second AC test signal when the controller closes the contactor; and
the detection circuit is further configured to:
receive a second AC return signal corresponding to the second AC test signal, and
detect the defective condition of the contactor based on the first and second AC return signals.

14. The system of claim 13, wherein the detection circuit is further configured to:
determine a difference between an amplitude of the first AC return signal and an amplitude of the second AC return signal; and
detect the defective condition of the contactor if the determined difference is less than a threshold.

15. The system of claim 11, wherein the controller is further configured to disconnect the battery string from the DC power bus if the contactor is defective.

16. The system of claim 11, wherein the first AC test signal has an amplitude ranging from about 10 μA to 25 mA and a frequency ranging from about 100 kHz to about 10 MHz.

17. The system of claim 11, wherein the coupling circuit is a transformer.

18. The system of claim 11, further comprising a resistor connected in parallel with the contactor.

19. The system of claim 11, wherein the detection circuit is further configured to provide a warning signal if the defective condition of the contactor is detected.

* * * * *